(12) United States Patent
Ge

(10) Patent No.: US 7,736,027 B2
(45) Date of Patent: *Jun. 15, 2010

(54) LED AND LED LAMP

(75) Inventor: Shichao Ge, Zhejiang (CN)

(73) Assignee: Mane Lou, Zheilang Province (CN)

( * ) Notice: Subject to any disclaimer, the term of this patent is extended or adjusted under 35 U.S.C. 154(b) by 0 days.

This patent is subject to a terminal disclaimer.

(21) Appl. No.: 12/265,911

(22) Filed: Nov. 6, 2008

(65) Prior Publication Data

US 2009/0059595 A1    Mar. 5, 2009

Related U.S. Application Data

(62) Division of application No. 10/500,315, filed as application No. PCT/CN02/00930 on Dec. 30, 2002, now Pat. No. 7,497,596.

(30) Foreign Application Priority Data

| Dec. 29, 2001 | (CN) | ................................ 01 1 45733 |
| Jan. 21, 2002 | (CN) | ............................ 02 2 03989 U |
| Mar. 9, 2002 | (CN) | ............................ 02 2 07287 U |
| Jun. 3, 2002 | (CN) | ............................ 02 2 36692 U |
| Dec. 12, 2002 | (CN) | ............................ 02 2 51586 U |

(51) Int. Cl.
*F21V 29/00* (2006.01)

(52) U.S. Cl. .................... 362/294; 362/373; 362/249.02
(58) Field of Classification Search ................. 362/294, 362/373, 235, 249.01, 249.02
See application file for complete search history.

(56) References Cited

U.S. PATENT DOCUMENTS

| 3,936,686 | A | 2/1976 | Moore |
| 4,885,668 | A | 12/1989 | Maglica et al. |
| 5,959,316 | A | 9/1999 | Lowery |
| 6,220,722 | B1 | 4/2001 | Begemann |
| 6,318,886 | B1 | 11/2001 | Stopa et al. |
| 6,367,949 | B1 | 4/2002 | Pederson |
| 6,476,549 | B2 | 11/2002 | Yu |

(Continued)

FOREIGN PATENT DOCUMENTS

CN          85104012          9/1986

(Continued)

*Primary Examiner*—Thomas M Sember
(74) *Attorney, Agent, or Firm*—Lowe Hauptman Ham & Berner LLP

(57) ABSTRACT

This invention relates to a light emitting diode (LED) and a LED lamp consisted of LEDs. The LED comprises at least one LED chip. The LED is mounted on a high heat conductivity base and is connected to an applied power supply through a circuit board. The LED chip also has a transparent medium layer on it. The base top surface acts as a light reflective surface, or a light reflective surface is provided around the base, the LED comprises a screw extended downwards from the base bottom or a screw hole in the base bottom to connect the LED to a heat sink mechanically. The LED is electrically connected to a driving circuit through its outgoing wires. The driving circuit is in turn electrically connected to an electrical connector through its housing. A LED lamp can be fabricated after the LED is enclosed in a transparent bulb housing. The LED has high efficiency, high power and long lifetime and can be used to fabricate LED traffic lamps, LED plane light sources, etc.

9 Claims, 8 Drawing Sheets

U.S. PATENT DOCUMENTS

| | | |
|---|---|---|
| 6,504,301 B1 | 1/2003 | Lowery |
| 6,568,833 B2 | 5/2003 | Worgan et al. |
| 6,659,632 B2 | 12/2003 | Chen |
| 6,827,470 B2 | 12/2004 | Sagal et al. |
| 7,150,553 B2 | 12/2006 | English et al. |
| 7,282,841 B2 | 10/2007 | Li |
| 2001/0030866 A1 | 10/2001 | Hochstein |
| 2002/0105001 A1 | 8/2002 | Strelchun |

FOREIGN PATENT DOCUMENTS

| | | |
|---|---|---|
| CN | 2305752 Y | 1/1999 |
| JP | 2000252524 A | 9/2000 |

LED AND LED LAMP

RELATED APPLICATIONS

The present application is a divisional of U.S. application Ser. No. 10/500,315 filed Jun. 28, 2004, now U.S. Pat. No. 7,497,596, which in turn is based on International Application No. PCT/CN02/00930 filed Dec. 30, 2002, and claims priority from Chinese Application Number 02251586.0 filed Dec. 12, 2002, Chinese Application Number 02236692.X filed Jun. 3, 2002, Chinese Application Number 02207287.X filed Mar. 9, 2002, Chinese Application Number 02203989.9 filed Jan. 21, 2002 and Chinese Application Number 01145733.3 filed Dec. 29, 2001, the disclosures of which are hereby incorporated by reference herein in their entirety.

TECHNICAL FIELD

This invention relates to a light emitting diode (LED) and LED lamp, more specifically to a high power, high efficiency and long lifetime LED and LED lamp devices, such as illumination lamp, traffic lamp and information display device etc.

BACKGROUND OF THE INVENTION

LED has been widely used in signal indication, large screen display, and has advantages of long lifetime, good color, sturdiness, etc. At the present, only low power LED can be fabricated. The power of typical LED is only 20 mA×4V=80 mW, because the increase of the operating current will cause the rapid increase of the LED chip temperature, and in turn the luminous efficiency will decrease nearly linearly with the chip temperature increase. The efficient escape of the large quantity of heat created by LED has become the key to fabricating LED and LED lamp.

For prior typical high power-LED, which is under developing as shown in FIG. 1, a LED chip 101 is bound on the light reflecting surface 102 of a metal base 103. The later is bound to a circuit board 106 by epoxy layer 111. The leads 104 and legs 105 of the LED chip 101 are connected to the electrical conduction layer 107 of the circuit board 106. An optical glue layer 108 and lens 109, 110 are provided on the chip 101. Element 110 is a fixing one.

It can be seen that LED chip is connected to a heat sink 113 via the metal base 103 (heat resistance $R_B$), epoxy layer 111 (heat resistance $R_E$), circuit board (heat resistance $R_P$) and binding glue 112 (heat resistance $R_A$). The total resistance $\Sigma R = R_B + R_E + R_P + R_A$ is great, so the chip temperature increases easily, and the luminous efficiency decreases rapidly. At the same time, the chip mounting metal base is glued to the circuit board 106. The epoxy glue is easy to be split after a long operating cycle under the condition of being cold and hot, expanded and contracted repeatedly due to the different heat expansion coefficient and different temperature increase speed between the circuit board and the metal base. Glue split increases RE, and results in LED damage by overheating. In summary, high power, high luminous efficiency and long lifetime LED for lighting is difficult for manufacturing by the prior art.

BRIEF SUMMARY OF THE INVENTION

The object of the invention is to overcome the disadvantages of great heat resistance between the LED and the heat sink, the rapid increase of the chip temperature and thereby the rapid decrease of the LED luminous efficiency; to overcome the disadvantages of glue split between the metal base and the circuit board after a long operating time due to the different heat expansion coefficient between them, the great heat resistance increase between LED and the heat sink and thereby the LED damage by overheating; so that a high power, high efficiency and long lifetime LED and LED lamp can be provided.

The object of the invention is achieved in such a way that the LED of the invention comprises at least one LED chip mounted on a high heat conductive base. The LED chip is electrically connected to an applied power supply and has a transparent medium layer on it. The base top surface acts as a light reflecting surface or a light reflecting surface is provided around the base, wherein, a circuit board is provided on or around the base.

The LED also includes at least one screw or a screw hole to mechanically connect the LED to a heat sink.

A light reflector is provided at the front of the LED chip.

The transparent medium includes optical glue and lens.

The LED chips emit same color light or different color light and are connected together in a serial or/and parallel form.

The base is a metal base, ultra high heat conductivity tubes or an assembly of a metal base and ultra high heat conductivity tubes provided on the bottom of the metal base.

The light reflector has a light reflecting surface, which make an angle in a range between 10° and 70° to the LED axis.

Light converting material is provided within the optical glue layer or between the optical glue layer and lens.

A LED lamp consisted of the above LED is characterized in that at least one above LED is mechanically connected to a heat sink, and the leads of the LED are electrically connected to an electrical connector through its housing, and the LED is enclosed in a transparent bulb housing.

The electrical connector is a double leg bayonet lamp head, multi-leg bayonet lamp head or screw lamp head.

The transparent bulb housing is transparent, colored, or light scattering bulb housing made of glass or plastic.

A light converting material layer is provided on the inner surface of the transparent bulb housing.

The heat sink has heat dispersing flanges.

The heat flange comprises a single spiral flange or a plurality of spiral flanges.

The inner surface of the heat sink is light reflective.

The inner surface of the heat sink is cylindrocanical or parabolic.

A traffic lamp consisted of the above LED is characterized in that the LED has a divergence angle between 3° and 60°, and is mounted on a heat sink near the focus of the parabolic reflector of the traffic lamp. The light from some of the LEDs is emitted outside of the window of the original traffic lamp and the remaiding light is radiated outside after reflecting form the parobalical light reflector of the original traffic lamp to obtain the light radiation with desired focus and uniform distribution.

A LED plane light source consisted of the above LEDS is characterized in that at least one LED is mounted on a heat sink consisted of a flat heat dispersing plate. The sink is located on the backside of and around the light guiding plate of the back illuminance source for plane light source or liquid crystal display. Light reflectors are disposed on both sides of or around the LED.

The LED comprises a plurality of LEDs emitting the same color light or different color light.

The advantages of the invention are as following:

(1) The heat sink is connected directly and closely to the base so that the heat resistance between the chip and the heat sink is nearly zero, and leading to the efficient escape of the heat created by the LED. In addition, the metal base is connected to the heat sink by metal screws and therefore the heat connection between them is reliable and unchangeable after a long time operation. Therefore, a high power, high efficiency and long lifetime LED can be fabricated;

(2) The circuit board is disposed on or around the metal base to facilitate the connection between chips and to facilitate dense installation, without the increase of the heat resistance between the chip and the sink.

(3) LED lamps and LED plane light source can be fabricated.

In summary, the LED of the invention may overcome the problems of the large heat resistance and glue split of the prior LED, and also may have a much smaller volume than the prior LED and thereby is adapted to dense installation.

| Denotation of the drawings | | | |
|---|---|---|---|
| LED chip | 101 | metal base | 103 |
| Circuit board | 106 | glue | 112 |
| Leads | 104 | LED leg | 105 |
| Optical glue | 108 | lens | 109 |
| Screw | 204 | heat conduction glue | 206 |
| Light conversion material | 213 | insulating layer | 303 |
| Color mixture | 409 | screw hole | 408 |
| Connection lead between chips | 410 | heat conduction layer | 407 |
| The housing of the driving circuit | | 604 input lead | 607 |
| Light conversion material layer | | 609 transparent bulb | 608 |
| Ultra-high heat conductivity tube | | 801 housing | |
| | | heat absorbing end | 803 |
| Transparent window | 1008 | heat dispersing plate | 1103 |
| Optical plate | 1107 | second circuit board | 1106 |
| Reflective surface | 102 | heat sink | 113 |

| -continued | | | |
|---|---|---|---|
| Denotation of the drawings | | | |
| Conductive layer | 107 | fixing device | 110 |
| Outgoing line | 209 | light reflector | 406 |
| Heat dispersing flange | 404 | driving circuit | 603 |
| Electrical connector | 605 | LED | 701 |
| Second transparent bulb housing | 908 | light guiding plate | 1104 |

DETAILED DESCRIPTION OF THE EMBODIMENTS

Embodiment 1

Figure 2:
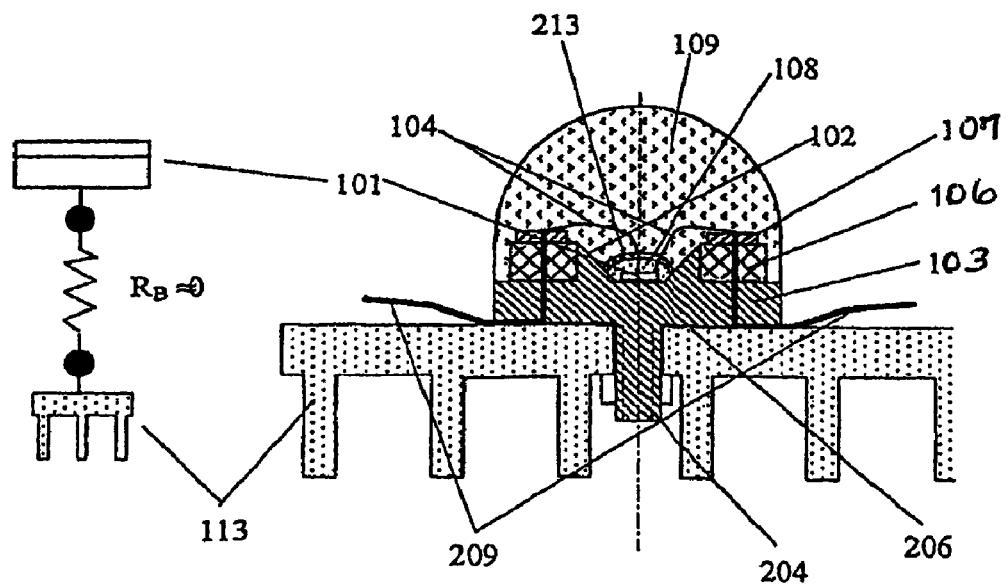
FIG. 2 is a structural schematic view of an embodiment of a LED according to the invention.

A LED of the invention, as shown in FIG. 2, is fabricated, in which at least one LED chip 101, such as yellow color light emitting LED, is mounted on the reflective surface of a metal base 103. When more than two LED chips 101 are used, the LED chips may emit the same color light or different color light. The metal base 103 is thermodynamically and mechanically connected to a heat sink 113 closely through at least one screw 204. Heat conduction glue 206 is provided between metal base 103 and the heat sink 113 to obtain better heat connection. A circuit board 106 is disposed on the metal base 103 and has an electrical conductive lager 107, to which outgoing leads 209 are connected. The outgoing leads 209 are insulated from the metal base and the heat sink 113, and are connected to an applied power supply. The LED chip 101 is connected to the circuit board 106 through leads 104. Optical glue 108 and lens 109 are provided on the LED chip 101, light conversion material 213 is provided between optical glue 108 and lens 109 to converse the light emitted from the LED chip 101 into different color light. The metal base is made of very low heat resistively copper, so, the heat created by the LED chip 101 is easy to escape, and the LED chip may operate in a high luminous efficiency condition at low temperate.

Embodiment 2

Figure 3:
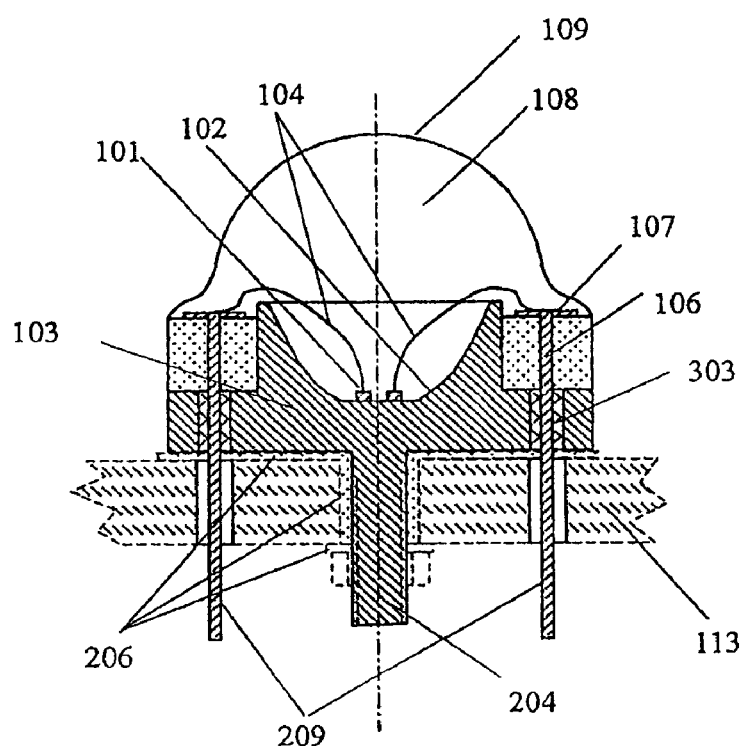
FIG. 3 is a structural schematic view of an embodiment of the lower leads of the LED according to the invention.

A LED of the invention is fabricated, in which lower leads are used, as shown in FIG. 3. At least one LED chip 101, for example two LED chips, are mounted on the light reflective surface 102 of the metal base 103. The LED chips emit different color light. The metal base 103 has at least one screw 204 to thermodynamically and mechanically connect the metal base 103 to the heat sink 113 closely. A circuit board 106 is disposed around the metal base 103 and has an electrical conductive lager 103 on it to connect outgoing leads 209. The outgoing wires extend right down wards though the insulation layer 303 and are connected to an applied power supply. Transparent medium is provided on the LED chip 101 and has a top surface designed to be spherical or ellipsoidal depending on the desired output light distribution. The metal base 103 is made of low heat resistively aluminum or its alloy. The remaining is the same as embodiment 1.

Embodiment 3

Figure 4:
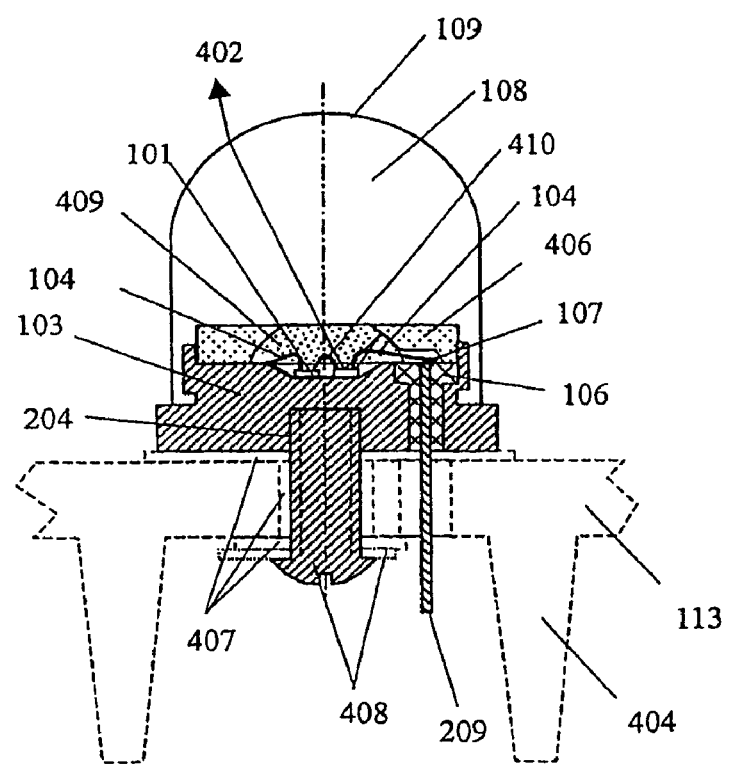
FIG. 4 is a structural schematic view of an embodiment of a LED according to the invention, wherein a light reflector is provided.

A LED of the invention, as shown in FIG. 4, is fabricated, in which a light reflector is provided, wherein, a light reflector is added over at least one LED chip 101 so that the light 402 emitted towards the LED sides may be reflected back to the LED chip 101 or the reflecting surface 102, and than emitted forwards. Therefore, the light availability factor is increased. When more than two LED chips are used and radiate different color light, color mixture may be provided between the reflector 406 and the LED chip 101 to enhance light color mixing effect. One electrode of one LED chip 101 is connected to the metal base 103, and then is led outside through at least one of the screw hole 408 and screw 204. The other electrode lead of the LED chip 101 is connected to the outgoing wire 209 through the lead 104. The outgoing wire 209 extends outside through the insulating layer 303 and then is connected to an applied power supply. A lead 410 is connected between each two adjacent LED chips. The heat sink has heat dispersing flanges. The heat conductive lager 407 is an electrical insulation layer. The remaining is the same as embodiment 2.

Embodiment 4

Figure 5:
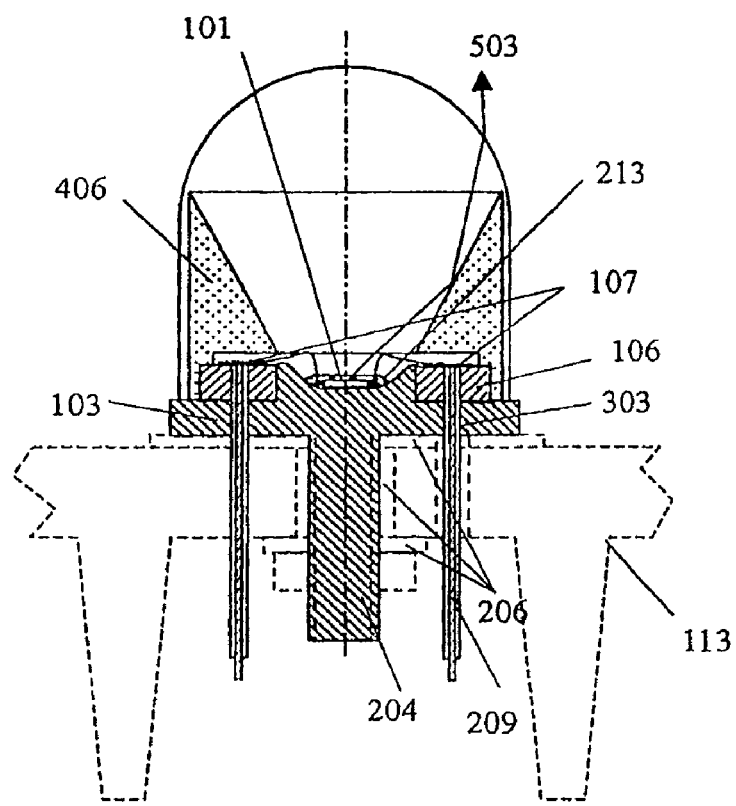
FIG. 5 is a structural schematic view of another embodiment of a LED according to the invention, wherein, a light reflector is provided.

A LED of the invention is fabricated, in which a light reflector is provided, as shown in FIG. 5, wherein, a light reflector 406 is added above the LED chip 101 such that the light 503 emitted towards the sides may be reflected forwards to increase light availability. Light conversion material 213 is provided on the surface of the LED chip 101. At least 2 outgoing wires 209 of the circuit board 106 extend outside right downwards through the metal lease 103 and are then connected to an applied power supply. The remaining is the same as embodiment 3.

Embodiment 5

Figure 6:
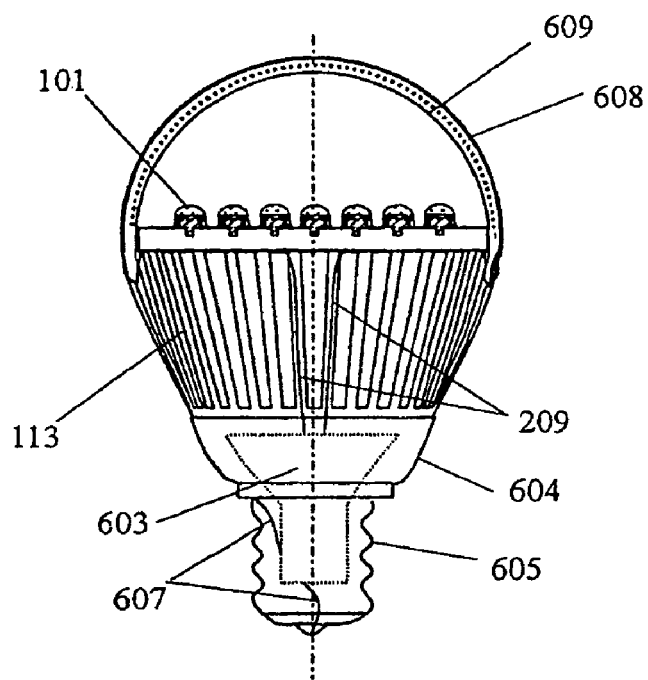
FIG. 6 is a structural schematic view of a LED lamp according to the invention.

A LED lamp consisted of the LED of the invention, as shown in FIG. 6, is fabricated, in which at least one LED chip 101 is mounted on the heat sink 113. The outgoing wires 209 of the LED are electrically connected to a driving circuit 603. The driving circuit 603 and its housing are connected to an electrical connector 605 through an input wire 607. The driving circuit 603 converts input voltage into the voltage adapted to the LED operation and to light the LED. A transparent bulb housing 608 made of glass houses the LED, and the inner surface of the transparent bulb housing is coated with a light conversion material layer 609 to convert the light emitted by the LED into a desired color light.

Embodiment 6

Figure 7A:
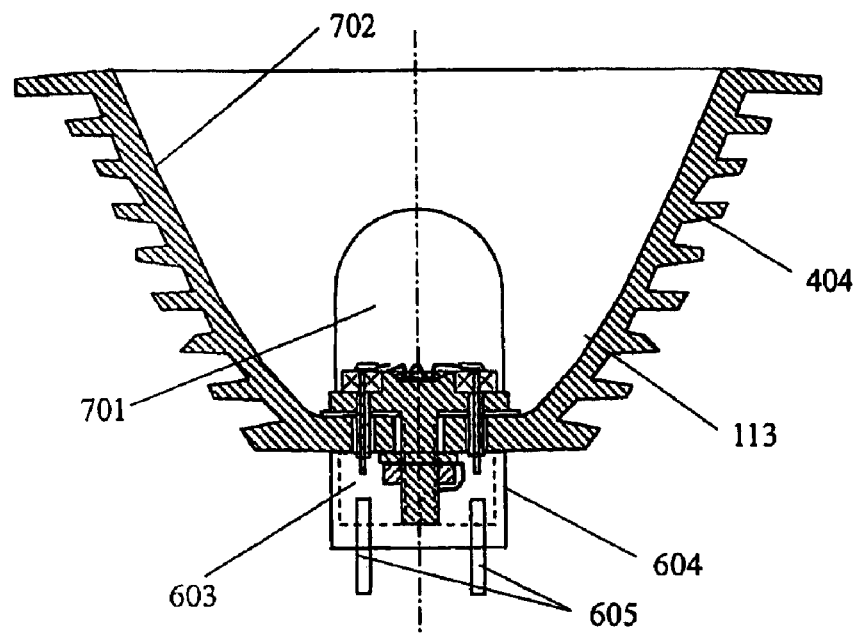
FIG. 7A is a structural schematic view of a LED lamp according to the invention, wherein, a parabolic heat sink is provided.
Figure 7B:
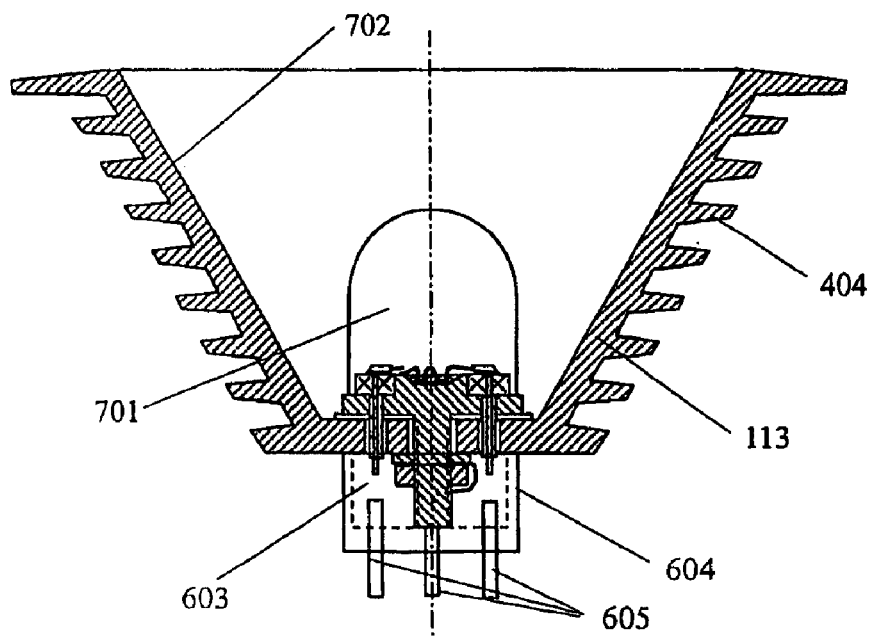
FIG. 7B is a structural schematic view of another embodiment of a LED lamp according to the invention, wherein, a cylindrocanic heat sink is provided.

A LED lamp of the invention is fabricated, in which a heat sink is provided, wherein, the LED 701 is mounted in a parabolic heat sink 113 as shown in FIG. 7A, or in a cylindrocanical heat sink 113, as shown in FIG. 7B. The heat sink has heat dispersing flanges 404 on it and its inner surface is a light reflective surface 702. In FIG. 7A the electrical connector 605 is a two-leg bayonet lamp head and is connected to an applied power supply. In FIG. 7B the electrical connector 605 is a three-leg bayonet lamp head and is connected to an applied power supply. The housing 604 of the driving circuit board 603 houses the driving circuit board 603. The remaining is the same as embodiment 1.

Embodiment 7

Figure 8:
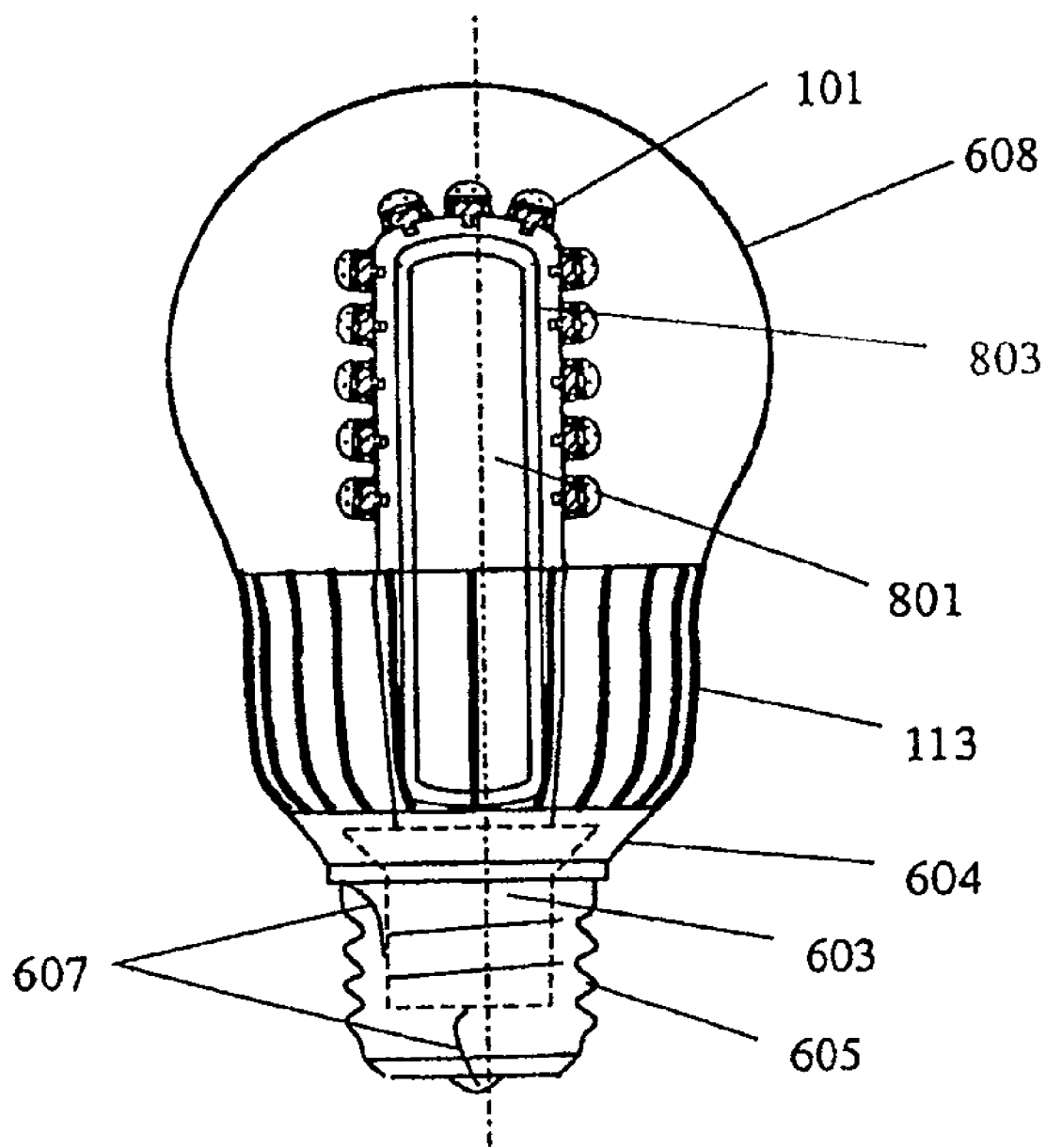
FIG. 8 is a structural schematic view of an embodiment of a LED lamp according to the invention, wherein, ultra-high heat conductivity tubes are provided.

A LED lamp of the invention is fabricated, in which, ultra-high heat conductivity tubes are provided as shown in FIG. 8, wherein, at least one LED 701 is mounted at the absorbing end 803 of a ultra-light heat conductive tube (called heat tube for short) 801, and the other end of the heat tube 801 is connected to a heat sink 113. Since the heat tube has heat conductivity 1500 times greater than copper has, its heat resistance is nearly zero, and therefore the heat created by the LED chip 101 can be transferred to the heat sink through the heat tube 801 rapidly and then escapes. The remaining is the same as embodiment 5.

Embodiment 8

Figure 9:
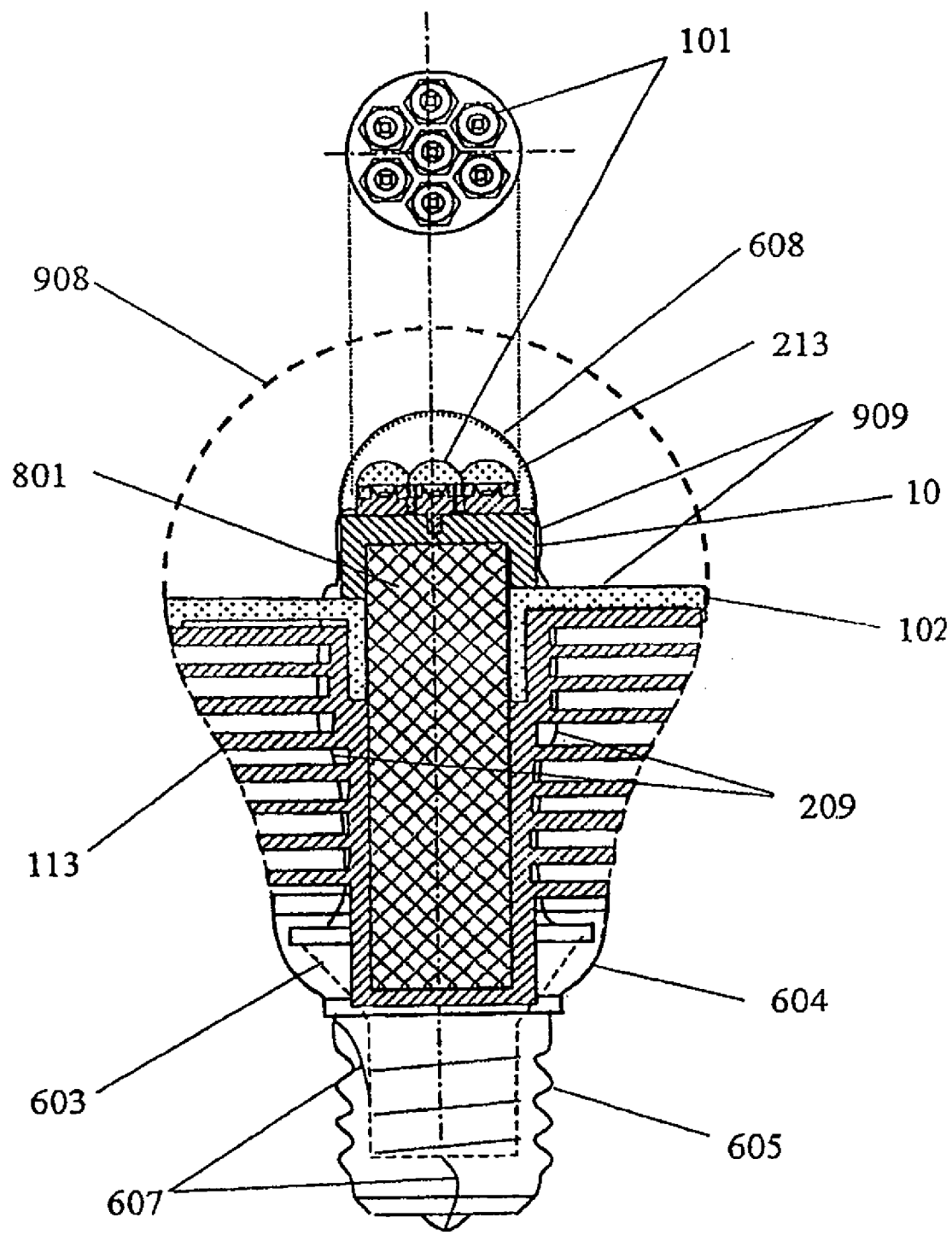
FIG. 9 is a structural schematic view of an embodiment of a LED lamp according to the invention, wherein, a bulb heat sink is provided.

A LED lamp of the invention is fabricated, in which an ultra-high heat conductivity tube and a bulb heat sink are provided, as shown in FIG. 9. In the LED lamp at least one LED chip 101 or LED 701 is mounted on a metal base 103. The metal base is made of a low resistively alloy and is mounded at the top end of the ultra-high heat conductivity tube 801. The other end of the heat tube 801 is connected to a heat sink. The heat sink has a plurality of spiral heat dispersing flanges of a bulb contour to accelerate air flow between flanges and enhance the heat dispersing effect of the heat sink. A reflective surface 102 is provided on the heat sink 113 and around the metal base 103. A transparent bulb housing 608 is mounted over the LED and has a light converting material layer on its inner surface. A second transparent bulb housing 908 is provided, as shown in FIG. 9. The remaining is the same as embodiment 5.

Embodiment 9

Figure 10:
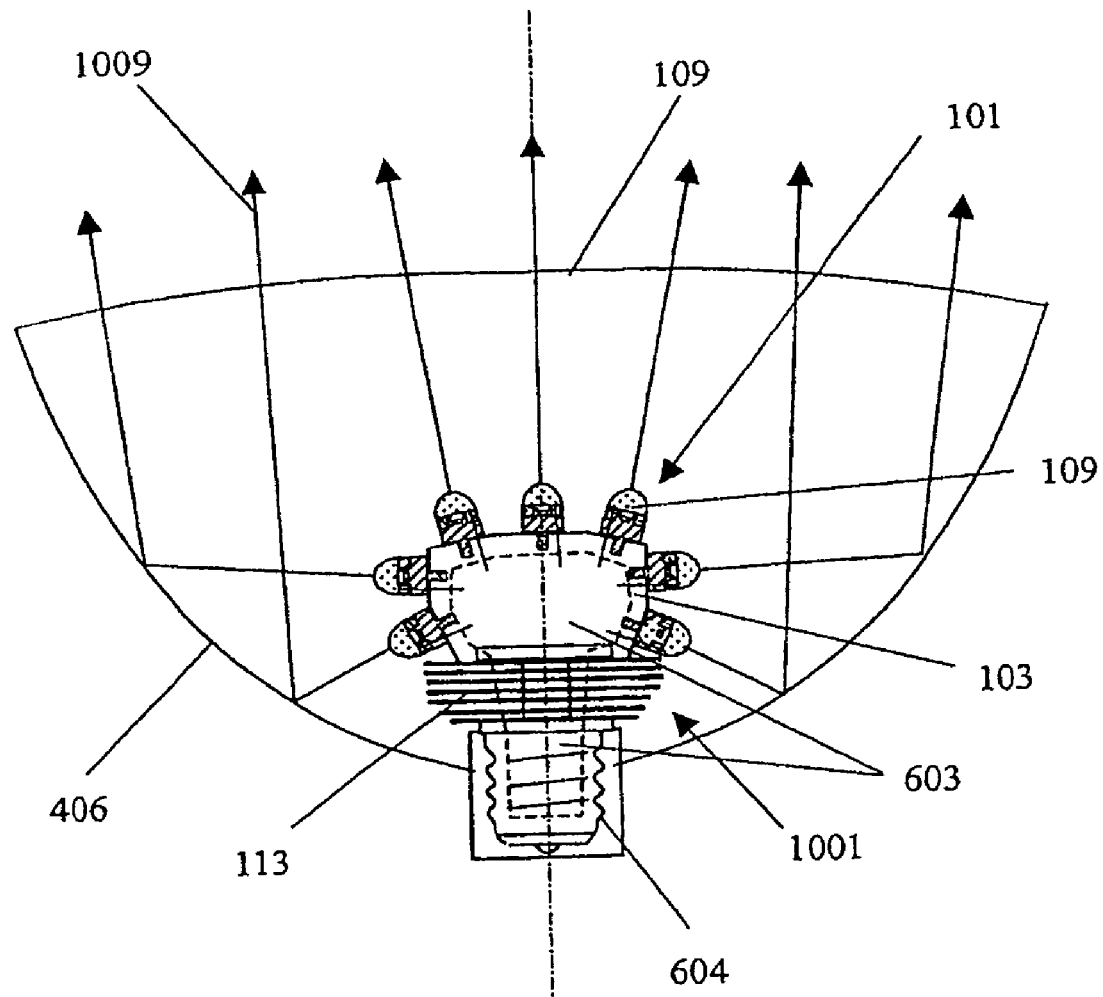
FIG. 10 is a structural schematic view of a traffic lamp consisted of the LED according to the invention.
Figure 11:
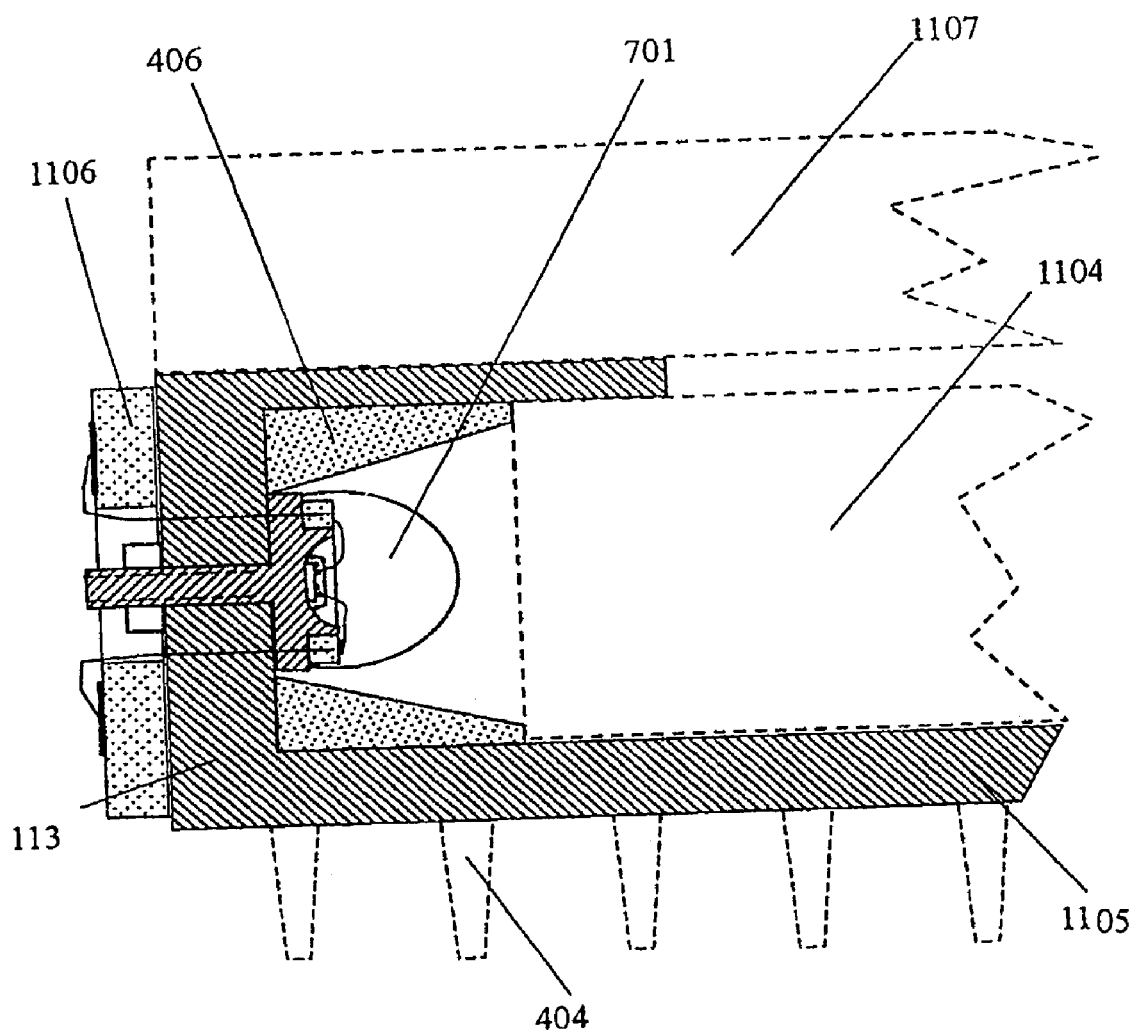
FIG. 11 is a structural schematic view of a plane light source consisted of LEDS according to the invention.

A traffic lamp consisted of LEDs of the invention, as shown in FIG. 10, is fabricated, in which at least one LED 701 is mounted on a good heat conductive metal base 103. The metal base 103 is connected to a heat dispersing device 113. The LED has a divergence angle of from 3°-60° and is mounted on a heat sink 113 near the focus of the parabolic light reflector of an original traffic lamp. The light emitted from some of the LEDS is emitted outside through the transparent window 1008 of the original traffic lamp, and the remaining light is emitted outside after reflecting from the parabolic light reflector 406. The LED traffic lamp may replace the prior tungsten traffic lamp directly. The remaining is the same as embodiment 5.

Embodiment 10

Figure 1:
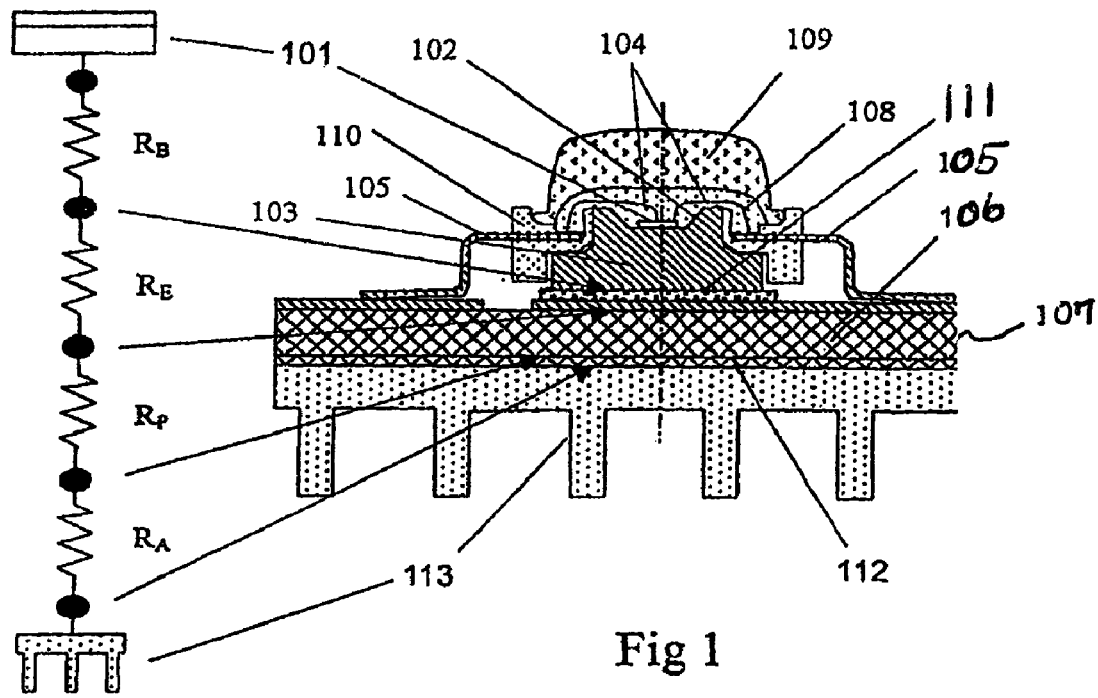
FIG. 1 is a structural schematic view of the prior LED.

A plane light source consisted of LEDS of the invention, as shown in FIG. 1, is fabricated, in which a LED 701 is mounted on a heat sink 113 having a flat heat plate 1103 of a large area. The heat dispersing plate 1103 is located on the back side of and around the light guiding plate 1104 of the plane light source. A second circuit board is provided on the back and outside of the heat sink 113 to connect the LEDs 701, and connect to an applied power supply. The heat dispersing plate 1103 may also have heat dispersing flanges 404. A light reflector 406 is located on the two sides of or around the LED 701 to efficiently couple the light emitted from the LED 701 into the light guiding plate 1104. An optical plate 1107 is provided as a liquid display plate, optical enhancement plate, scattering plate or a transparent plate with pattern and/or text, etc. The at least one LED 701 emits the same color light or different color light. Plane light source and back illumination light source of white light of different color temperature, color light or color changeable light can be achieved through control of the brilliance of respective LED emitting different color light.

The invention claimed is:
1. A light emitting diode (LED), comprising:
a high heat conducting base having a light reflective surface disposed thereon;
at least one LED chip directly mounted on the base;

a circuit board disposed on an upper surface of the base and electrically connected to the at least one LED chip, the circuit board configured to electrically connect the at least one LED chip to a power supply;

a transparent medium layer disposed on the base;

one of a screw and screw hole integrally disposed in a bottom surface of the base; and a heat sink mechanically and directly connected to the bottom surface of the base via said screw or screw hole.

2. The LED according to claim 1, further comprising a light reflector at a front side of the LED chip.

3. The LED according to claim 2, wherein, an angle between the light reflecting surface and an LED axis is an angle from about 10 degrees to 70 degrees.

4. The LED according to claim 1, wherein, the transparent medium includes optical glue and a lens.

5. The LED according to claim 4, further comprising light converting material disposed at at least one of between the optical glue and the lens, and in the optical glue.

6. The LED according to claim 1, wherein, the at least one LED chip includes a plurality of LED chips connected to each other in at least one of a serial and parallel form.

7. The LED according to claim 1, wherein the base is copper, aluminum, or an aluminum alloy.

8. The LED according to claim 1, wherein the screw is integral to the bottom surface of the metal base.

9. A light emitting diode (LED), comprising:

at least one LED chip directly mounted on a metallic base having a high heat conductivity and a light reflective surface, the at least one LED chip having a transparent medium layer disposed thereon;

a circuit board configured to electrically connect the at least one LED chip to a power supply;

a screw or screw hole integrated on a bottom surface of the base; and a heat sink mechanically and directly connected to the bottom surface of the base via said screw or screw hole;

wherein the base is disposed between the circuit board and the heat sink.

* * * * *